United States Patent
Hoga et al.

(12) 
(10) Patent No.: US 7,289,657 B2
(45) Date of Patent: Oct. 30, 2007

(54) METHOD OF INSPECTING PHOTO-MASK

(75) Inventors: Morihisa Hoga, Tokyo-to (JP); Hiroyuki Inomata, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 538 days.

(21) Appl. No.: 10/411,610

(22) Filed: Apr. 10, 2003

(65) Prior Publication Data

US 2003/0194618 A1 Oct. 16, 2003

(30) Foreign Application Priority Data

Apr. 12, 2002 (JP) .............................. 2002-111262

(51) Int. Cl.
*G06K 9/00* (2006.01)
(52) U.S. Cl. ...................... 382/144; 156/64; 156/152; 250/307; 250/492.2; 382/145; 382/149; 430/5
(58) Field of Classification Search ................ 250/306, 250/492.2, 307; 324/537, 754; 382/144, 382/218, 145, 149; 156/64, 152; 430/5
See application file for complete search history.

(56) References Cited

U.S. PATENT DOCUMENTS

| | | | | |
|---|---|---|---|---|
| 4,701,859 A | * | 10/1987 | Matsuyama et al. ........ 382/144 |
| 5,508,132 A | * | 4/1996 | Komatsu ........................ 430/5 |
| 5,786,112 A | * | 7/1998 | Okamoto et al. .............. 430/5 |
| 6,233,182 B1 | * | 5/2001 | Satou et al. ................ 365/200 |
| 6,249,114 B1 | * | 6/2001 | Sakai ........................ 324/72.5 |
| 6,264,773 B1 | * | 7/2001 | Cerio ........................... 156/64 |
| 6,406,573 B1 | * | 6/2002 | Cerio ........................... 156/64 |
| 6,467,056 B1 | * | 10/2002 | Satou et al. ................. 714/720 |
| 6,727,500 B1 | * | 4/2004 | Berger et al. ............... 250/306 |
| 6,893,780 B1 | * | 5/2005 | Galan et al. .................... 430/5 |
| 2003/0194618 A1 | * | 10/2003 | Hoga et al. ..................... 430/5 |

* cited by examiner

*Primary Examiner*—Gregory M Desire
(74) *Attorney, Agent, or Firm*—Ladas & Parry LLP

(57) ABSTRACT

Provided is a method of inspecting a photo-mask, which enables performing destruction inspection such as contact-type inspection and cross section inspection. The method of inspecting a photo-mask comprises performing destruction inspection with respect to the photo-mask for inspection, by using one of two photo-masks that have been successively manufactured under the same conditions that are set, as a photo-mask for inspection, and using the other of them as a product.

8 Claims, No Drawings

METHOD OF INSPECTING PHOTO-MASK

BACKGROUND OF THE INVENTION

1. Field of the Invention

The present invention relates to a method of inspecting that is executed when manufacturing a high-density integrated circuit such as an LSI, super-LSI, etc. or a photo-mask, etc.

2. Description of the Related Art

As the quality inspection that is performed when manufacturing a photo-mask, there are dimension inspection, coordinate inspection, defect inspection, etc. Since those kinds of inspections is performed by using a method of radiating a laser light onto the photo-mask and thereby performing relevant measurement or is performed by performing relevant measurement with use of an electronic microscope, they have hitherto been performed with respect to a respective one of the individual photo-masks that have been manufactured.

However, since the inspection method using a contact-type measuring instrument, or the inspection method performing inspection by cutting a photo-mask and inspecting the resulting cross section, etc. are likely to damage the surface or cannot be performed unless the photo-mask is destroyed, each of those inspection methods had a problem in that it is impossible to perform quality inspection.

Also, in each of those inspection methods, there is the possibility that, after inspection of the photo-mask, foreign matter will attach onto it. In addition, even the photo-mask whose measured result has been good after measurement must be re-cleaned, and a plurality of inspections cannot be simultaneously performed, and so forth. Each of those inspection methods, therefore, had a problem from the viewpoint, as well, of the operation efficiency.

SUMMARY OF THE INVENTION

Under these existing circumstances, it has been desired to provide a method of inspecting a photo-mask that enables doing destruction inspection such as contact-type inspection and cross section inspection in which a cross section of the relevant photo-mask is inspected.

The fist aspect of the present invention provides a method of inspecting a photo-mask, comprising performing destruction inspection with respect to the photo-mask for inspection, by using one of two photo-masks that have been successively manufactured under the same conditions that are set, as a photo-mask for inspection, and using the other of them as a product.

According to the first aspect of the present invention, in the photo-masks that have been successively manufactured under the same conditions that are already set, the actual working conditions thereof can regarded as being the same. Therefore, it is possible to handle the results of working as being the same. Therefore, by using one of those photo-masks as a photo-mask for inspection and using the other of them as a photo-mask product, a technique is adopted of using the result of inspection obtained from the photo-mask for inspection as the data for the photo-mask product. Accordingly, regarding the photo-mask that is handled as a product, destruction inspection, impossible to perform with respect thereto, is performed with respect to the photo-mask for use for inspection. By doing so, it becomes possible to obtain data that is substantially the same as that which would be obtained if having performed destruction inspection with respect to the photo-mask for use as a product. This enables enhancing the quality of the photo-mask for use as a product.

In the first aspect of the present invention, it is preferable that the destruction inspection is contact-type inspection.

Regarding the photo-mask for use as a product, the contact-type inspection has the difficulty of being performed because of the possibility that the photo-mask is damaged by contact. However, in the first aspect of the present invention, contact-type inspection can be performed with respect to the photo-mask for inspection. As a result, it becomes possible to obtain substantially the same data, as that which would be obtained when performing with respect to the photo-mask for use as a product, without damaging the photo-mask for use as a product As a result, it is possible to enhance the quality of the product.

In the first aspect of the present invention, it is preferable that the destruction inspection is inspection that is performed with respect to a cross section of the photo-mask.

The cross section inspection with respect to a photo-mask for use as a product is conventionally impossible to perform unless destroying the product. However, in the first aspect of the present invention, since cross section inspection is performed with respect to using the photo-mask for inspection, it becomes possible to inspect without destroying the photo-mask for use as a product.

The second aspect of the present invention provides a method of manufacturing a photo-mask comprising a process of inspection that is executed in the method of inspecting according to the first aspect of the present invention.

According to the second aspect of the present invention, when manufacturing a photo-mask, as a result of the invention's having the process of inspection it becomes possible to inspect the product with a high accuracy and therefore to enhance the quality of the photo-mask obtained.

DESCRIPTION OF THE PREFERRED EMBODIMENT

The present invention relates to a method of inspecting a photo-mask and a method of manufacturing it. Each of them will hereafter be explained.

1. Method of Inspecting a Photo-Mask

In the method of inspecting a photo-mask according to the present invention, one of the two photo-masks that have been successively manufactured under the same conditions that are already set is used as a photo-mask for inspection and the other of them is used as a photo-mask product, thereby destruction inspection is performed with respect to the photo-mask for use for inspection.

According to the present invention, since the photo-masks that have been successively manufactured under the same conditions that are already set are substantially the same in terms of both the setting conditions and the manufacturing conditions, the configurations, performances, etc. of the photo-masks that have been manufactured can be regarded as being substantially the same between those photo-masks. Therefore, by using, for destruction inspection, one of the photo-masks that have been successively manufactured under the same conditions that are set, it becomes possible to obtain substantially the same data as that which would be obtained if having performed destruction inspection with respect to the photo-mask for use as a product. As a result of this, it becomes possible to enhance the quality of the product. In addition, since it is possible to perform inspection in parallel with manufacture, the method according to the present invention is useful from the viewpoint, as well, of the manufacturing efficiency.

Respective constructions of the method of inspecting a photo-mask according to the present invention will hereafter be explained.

A. Photo-Mask

The photo-mask of the present invention is not particularly limited in terms of its kind, pattern, etc. if the two photo-masks have been successively manufactured under the same conditions that are set. The reason for this is that by the photo-mask's being the ones that have been successively manufactured, the configurations thereof, performances thereof, etc. can be regarded as being substantially the same between the photo-mask fellows.

The photo-mask with respect to which the present invention is useful includes Levenson type phase shift masks, HT-PSM type photo-masks, stencil masks, membrane masks, reflective masks, and the like. The reason for this is as follows. In each of those photo-masks, it is difficult to measure the digged depth, etc. of the pattern if only performing the defect inspection, coordinate inspection, and dimension inspection. By performing the cross section inspection, that measurement becomes possible for the first time.

Also, if it is the one that is manufactured successively to a photo-mask for use as a product and that is manufactured passing through the same process as in the case of the latter, the photo-mask for use for inspection may be a photo-mask that only has formed with respect thereto a pattern portion used for inspection. As a result of the photo-mask's for use for inspection being the one that only has that pattern portion used for inspection, it is impossible to shorten the manufacturing amount of time and, in addition, that is advantageous from the viewpoint of the cost and manufacturing efficiency.

B. Destruction Inspection

The destruction inspection of the present invention is not particularly limited if it is inspection that is unable to be performed if the photo-mask is the one for use as a product, such as a contact-type inspection such as that performed using a surface configuration-measuring device, inspection with respect to a cross section of the photo-mask, composition analysis, resistance-to-chemical inspection, resistance-to-light inspection, etc.

With respect to the photo-mask for use as a product, the method of inspecting using a contact-type measuring instrument, the method of inspecting a cross section of the relevant photo-mask by cutting that photo-mask, etc. cannot be executed because it is possible that the surface will be damaged or the photo-mask cannot be measured unless destroyed. For this reason, in the present invention, by using, as the photo-mask for use for destruction inspection, one of the above-described photo-masks successively manufactured under the same conditions that have been set, it becomes possible to obtain substantially the same inspection result as that which would be obtained if having performed the same inspection with respect to the photo-mask for use as a product. By this, it becomes possible to enhance the quality of the photo-mask for use as a product.

Also, in the present invention, regarding the photo-mask for use for inspection, inspections other than destruction inspection may be performed with respect thereto before performing the destruction inspection The reason for this is as follows. Since, by that, it becomes possible to perform a plurality of inspections in parallel, it becomes possible to enhance the manufacturing efficiency.

C. Others

In the present invention, with respect to the photo-mask for use as a product, other inspections than the destruction inspection, such as inspection of pattern defects, may be performed. By performing other inspections than the destruction inspection with respect to the individual photo-masks being used as products, it is possible to enhance the accuracy of the inspection. Further by performing those other inspections in parallel with the destruction inspection, the present invention can provide an advantage from the viewpoint of the manufacturing efficiency, etc.

2. Method of Manufacturing a Photo-Mask

A method of manufacturing a photo-mask according to the present invention is the one that has the above-described process of inspection that is executed in the method of inspecting.

Regarding the method of manufacturing a photo-mask according to the present invention, if it is a method of manufacturing a photo-mask that comprises the above-described process of inspection, no particular limitation is imposed on the sequential order of those processes, and the kind and pattern of the photo-mask.

The reason for this is as follows. By the above-described processes of inspection being included in the manufacturing processes, it becomes possible to enhance the quality of the photo-mask used as a product and to enhance the manufacturing efficiency.

Incidentally, the present invention is not limited to the above-described embodiment. The above-described embodiment is only illustrative. Further, a method having substantially the same technical idea as that described in the claims of the present invention and having the same functions and effects is included within the technical scope of the present invention even if it is any other type than that described above.

What is claimed is:

1. A method of inspecting a photo-mask comprising:
providing a plurality of photo-masks manufactured under substantially same conditions;
selecting one of the plurality of photo-masks; and
destructively inspecting the selected photo-mask for pass or fail determined according to a predetermined inspection criteria (also known as the "destruction inspection"),
wherein the photo-mask subjected to the destruction inspection suffers damages such that the photo-mask subjected to the destruction inspection is not restorable to perform the designed functions of a photo-mask,
wherein when the result of the destruction inspection is fail, the plurality of photo-masks are considered as also having failed the inspection, and
wherein when the result of the destruction inspection is pass, the plurality of photo-masks are considered as also having passed the inspection.

2. The method of inspecting a photo-mask according to claim 1, wherein the destruction inspection is contact-type inspection.

3. The method of inspecting a photo-mask according to claim 1, wherein the destruction inspection is inspection that is performed with respect to a cross section of the photo-mask.

4. The method of claim 1, wherein the plurality of photo-masks are manufactured under substantially same setting and manufacturing conditions such that the configuration and the performance capability of the plurality of photo-masks are considered to be substantially same.

5. A method of manufacturing a photo-mask comprising a step of:

manufacturing a plurality of photo-masks under substantially same conditions;

selecting one of the plurality of photo-masks: and destructively inspecting the selected photo-mask for pass or fail determined according to a predetermined inspection criteria (also known as the "destruction inspection").

wherein the photo-mask subjected to the destruction inspection suffers damages such that the photo-mask subjected to the destruction inspection is not restorable to perform the designed functions of a photo-mask, wherein when the result of the destruction inspection is fail, the plurality of photo-masks are considered as also having failed the inspection, and wherein when the result of the destruction inspection is pass, the plurality of photo-masks are considered as also having passed the inspection.

6. The method of claim 5, wherein the destruction inspection is contact-type inspection.

7. The method of claim 5, wherein the destruction inspection is inspection that is performed with respect to a cross section of the photo-mask.

8. The method of claim 5, wherein the plurality of photo-masks are manufactured under substantially same setting and manufacturing conditions such that the configuration and the performance capability of the plurality of photo-masks are considered to be substantially same.

* * * * *